US008187900B2

(12) United States Patent
Lin et al.

(10) Patent No.: US 8,187,900 B2
(45) Date of Patent: May 29, 2012

(54) OPTIMIZATION OF POLISHING STOP DESIGN

(75) Inventors: Li Min Lin, Hong Kong (HK); Ka Wah Chan, Hong Kong (HK); Sheng Mei Zheng, Shenzhen (CN); Yong Cai, Suzhou (CN)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 100 days.

(21) Appl. No.: 12/912,727

(22) Filed: Oct. 26, 2010

(65) Prior Publication Data
US 2011/0037051 A1 Feb. 17, 2011

Related U.S. Application Data

(63) Continuation-in-part of application No. 11/891,466, filed on Aug. 10, 2007, and a continuation-in-part of application No. 12/058,059, filed on Mar. 28, 2008, now Pat. No. 7,846,753, and a continuation-in-part of application No. 12/415,467, filed on Mar. 31, 2009, now Pat. No. 7,985,971.

(51) Int. Cl.
H01L 21/00 (2006.01)
H01L 21/46 (2006.01)
H01L 21/30 (2006.01)

(52) U.S. Cl. ............. 438/46; 438/26; 438/458; 438/455

(58) Field of Classification Search .................... 438/26, 438/46, 458, 455
See application file for complete search history.

(56) References Cited

U.S. PATENT DOCUMENTS

| 5,332,467 | A | 7/1994 | Sune |
| 5,977,565 | A | 11/1999 | Ishikawa |
| 6,078,064 | A * | 6/2000 | Ming-Jiunn et al. .......... 257/103 |
| 6,455,340 | B1 | 9/2002 | Chua |
| 7,001,824 | B2 | 2/2006 | Hon |

(Continued)

FOREIGN PATENT DOCUMENTS

CN 1510765 A 7/2004

(Continued)

OTHER PUBLICATIONS

International Search Report issued Jan. 7, 2010 in related application PCT/CN2009/071047.

(Continued)

*Primary Examiner* — Luan C Thai
(74) *Attorney, Agent, or Firm* — Ella Cheong Hong Kong; Margaret A. Burke; Sam T. Yip

(57) ABSTRACT

The present invention provides a method of fabricating vertical LED structures in which the substrate used for epitaxial layer growth is removed through polishing. The polishing technique used in an exemplary embodiment is chemical mechanical polishing using polish stops to provide a sufficiently level plane. Polish stops are provided in the multilayer structure before polishing the surface, the hardness of the polish stop material being greater than the hardness of the material that needs to be removed. Consequently, vertical LEDs can be produced at a lower cost and higher yield compared to either laser lift-off or conventional polishing. Exemplary vertical LEDs are GaN LEDs. The polish stops may be removed by saw dicing, laser dicing or plasma etching.

21 Claims, 4 Drawing Sheets

U.S. PATENT DOCUMENTS

| | | | |
|---|---|---|---|
| 7,015,117 B2 | 3/2006 | Urbanek | |
| 7,033,858 B2 * | 4/2006 | Chai et al. | 438/106 |
| 7,125,741 B2 | 10/2006 | Yen | |
| 7,501,299 B2 | 3/2009 | Wong | |
| 7,535,100 B2 | 5/2009 | Kub | |
| 7,573,076 B2 | 8/2009 | Baik | |
| 8,106,417 B2 * | 1/2012 | Yoo | 257/99 |
| 2004/0115849 A1 | 6/2004 | Iwafuchi | |
| 2005/0009345 A1 | 1/2005 | Yen | |
| 2006/0094207 A1 * | 5/2006 | Yoo | 438/458 |
| 2006/0244001 A1 * | 11/2006 | Lee et al. | 257/103 |
| 2006/0255341 A1 | 11/2006 | Pinnington | |
| 2007/0126022 A1 | 6/2007 | Baik | |
| 2008/0197367 A1 | 8/2008 | Cai | |
| 2009/0039383 A1 | 2/2009 | Chu | |
| 2009/0218590 A1 | 9/2009 | Cai | |

FOREIGN PATENT DOCUMENTS

| | | |
|---|---|---|
| JP | 2007-158334 A | 6/2007 |
| WO | WO-2009/021416 A | 2/2009 |

OTHER PUBLICATIONS

International Search Report in related U.S. Appl. No. 12/058,059.

* cited by examiner

OPTIMIZATION OF POLISHING STOP DESIGN

CROSS-REFERENCE TO RELATED APPLICATIONS

This application is a continuation-in-part of U.S. patent application Ser. No. 11/891,466, filed Aug. 10, 2007, U.S. patent application Ser. No. 12/058,059 filed Mar. 22, 2008, and U.S. patent application Ser. No. 12/415,467 filed Mar. 31, 2009, the disclosures of which are incorporated by reference herein.

FIELD OF INVENTION

The present invention relates to the LED fabrication and, more particularly, vertical LED fabrication.

BACKGROUND

A conventional method of producing a flip-chip light emitting diode element, involves depositing a plurality of epitaxial semiconductor layers on a sapphire substrate to produce an epitaxial semiconductor structure on a wafer. From the epitaxial layers, a plurality of light emitting diode elements is produced. The wafer is cut to produce an element die. Flip-chip techniques are used to connect the element die to a fixing plate. The flip-chip connecting process comprises fixing the element die at the fixing plate by connecting at least one electrode of the element die to at least one pad of the fixing plate.

Currently, there is a thin-film based light emitting diode (LED) element to replace the flip-chip light emitting diode element. In comparison to the flip-chip light emitting diode element, a thin-film GaN light emitting diode element has the advantages of low heat resistance, uniform current in the n-type layer and the p-type layer, and low cost. In a thin-film light emitting diode element, the epitaxial wafer is directly bonded to a conductive carrier substrate. Through a laser lift-off process, a GaN layer is decomposed through the use of an excimer laser, permitting removal of the sapphire substrate while maintaining an active region.

The above-described laser lift-off method of removing sapphire substrate is disclosed in U.S. Pat. Nos. 6,455,340, 7,001,824 and 7,015,117. The current laser lift-off approach for making GaN light emitting diodes is incompatible with conventional semiconductor processes as it involves the use of expensive laser equipment and also causes damage to the remaining semiconductor layers such as cracking.

If the laser lift-off process is replaced by a polishing process, such as chemical mechanical polishing (CMP), significant cost savings can be realized. Moreover, polishing is a milder method resulting in less damage than laser lift-off. However, when using CMP, if a plane to be polished is too large, unevenness between sides and center positions of the plane will also be too large. Therefore, the required standard of a flat plane during mass production of semiconductor devices cannot be achieved, lowering the device production yield. Thus, there is a need in the art for a method of substrate removal that is susceptible to mass production at a low cost with high device yield.

SUMMARY OF INVENTION

The present invention provides a method of fabricating vertical LED structures in which the substrate used for epitaxial layer growth is removed through polishing. The polishing technique used in an exemplary embodiment is chemical mechanical polishing using polish stops to provide a sufficiently level plane. The method overcomes the problem of large deviations between side and center locations as compared to conventional polishing techniques. Polish stops are provided in the multilayer structure before polishing the surface, the hardness of the polish stop material being greater than the hardness of the material that needs to be removed. Consequently, vertical LEDs can be produced at a lower cost and higher yield compared to either laser lift-off or conventional polishing.

A method of fabricating a compound semiconductor vertical light emitting diode includes providing a first substrate which is capable of supporting compound semiconductor epitaxial growth. A layer of undoped compound semiconductor is formed over the first substrate, followed by growth of n-doped compound semiconductor and formation of a multiple quantum well active layer. A p-doped compound semiconductor compound semiconductor layer and electrode/mirror are formed over the multiple quantum well active layer. Plural vertical polish stops pass through the p-doped compound semiconductor layer, the active layer, and terminate in either the n-doped compound semiconductor layer or the undoped compound semiconductor layer. The polish stops are formed from a material having a hardness greater than the hardness of the compound semiconductor.

A conductive host substrate layer is formed over the p-electrode-including layer; the conductive host can be deposited or bonded to the structure. The first substrate and at least a portion of the undoped compound semiconductor layer are polished away to reveal at least a portion of the n-doped compound semiconductor layer followed by formation of an n-electrode thereon.

The polish stops can be removed after polishing away the first substrate and undoped compound semiconductor layer. This improves the light emission from the LED if the polishing stop material has light absorption. In an exemplary embodiment, the compound semiconductor is a GaN-based compound semiconductor. The polishing can be grinding, lapping, polishing or chemical-mechanical polishing (CMP).

DETAILED DESCRIPTION OF THE INVENTION

Figure 1:
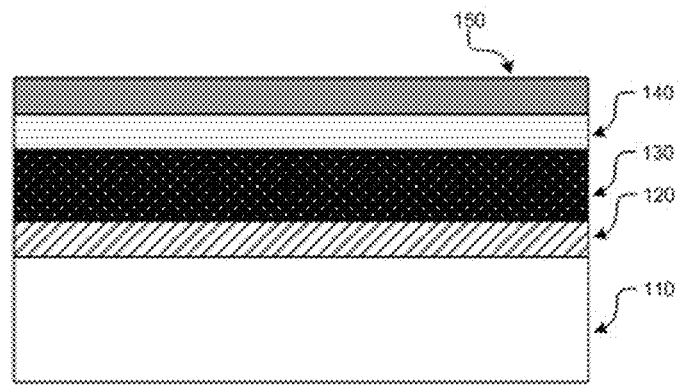
FIG. 1 shows a multilayer compound semiconductor starting structure according to one embodiment of the present invention

The present invention provides an improved method for forming compound semiconductor vertical LEDs. The method results in higher yield, lower costs, and enhanced light output. An overview of a process according to one embodiment of the present invention is depicted in FIGS. 1-11. In FIG. 1, a first substrate capable of supporting epitaxial growth 110 is provided. Exemplary substrate materials include sapphire, silicon, MN, SiC, GaAs, and GaP although it is understood that any material capable of supporting the epitaxial growth of a subsequently-formed compound semiconductor material layer may be used as substrate 110. An epitaxial layer 120 of undoped compound semiconductor such as GaN or GaInN is formed on substrate 110. As used herein, the expression "undoped" includes lightly-doped materials, that is, materials that include dopants at a level below that typically used to form n-doped or p-doped layers. Although GaN or GaInN are exemplary materials, it is understood that other compound semiconductors such as InGaP, AlInGaN, AlInGaP, AlGaAs, GaAsP or InGaAsP can also be used depending upon the overall desired color of the LED.

An n-doped compound semiconductor material layer 130 is formed over undoped compound semiconductor layer 120. As used herein, the term "over" means that the layer is above layer 120 but may be separated from layer 120 by optional additional material layers. In an exemplary embodiment, layer 130 is n-doped GaN. Note that although an n-doped compound semiconductor material layer is depicted, alternatively a p-doped compound semiconductor may be formed.

Over the n-doped layer 130, a multiple quantum well (MQW) active layer 140 is formed. The multiple quantum well may include alternating n-doped GaN and p-doped GaN layers or alternating GaN and MN layers; however, other MQW structures may include one or more of GaN, MN, InGaP, AlInGaN, AlInGaP, AlGaAs, GaAsP or InGaAsP. Although these materials are listed for convenience as stoichiometric compounds, off-stoichiometric versions of the compounds are also employed depending on the desired bandgap. It is understood that any MQW structure may be used as layer 140 based on the considerations of compatibility with the other selected compound semiconductor layers and the desired LED color.

Over MQW layer 140, a p-doped compound semiconductor material layer 150 is formed. In the exemplary embodiment, this is p-doped GaN. However, when layer 130 is selected to be a p-doped compound semiconductor material, layer 150 is selected to be an n-doped compound semiconductor material.

Figure 2:
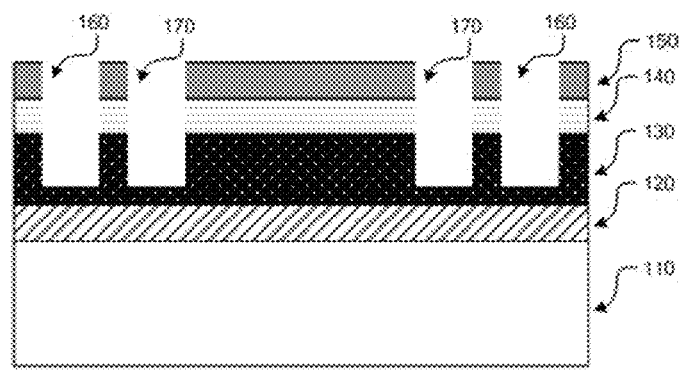
FIG. 2 depicts mesa polishing.

Following formation of the starting material layers for a vertical LED, trenches 160 and trenches 170 are formed in the multilayer structure, depicted in FIG. 2. Dry etching such as plasma etching and, particularly, inductively-coupled plasma etching, is selected for formation of trenches 160 and 170. Although the FIGS. depict the terminal positions of trenches 160 and 170 as being in n-doped layer 130, alternatively the trenches may terminate in undoped layer 120. Trenches 160 will be used for the formation of the polish stops while trenches 170 will contain filler material and be used as a separation point for device fabrication.

Figure 3:
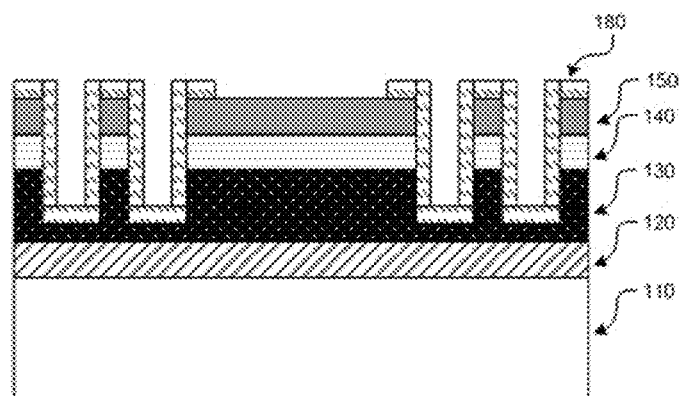
FIG. 3 shows dielectric growth for passivation.

After trenches 160 and 170 have been created, a passivation material layer 180 is deposited as seen in FIG. 3. The passivation material covers the trenches sidewalls and base. Selected passivation materials include dielectrics such as silicon oxides, silicon nitrides, etc.

Figure 4:
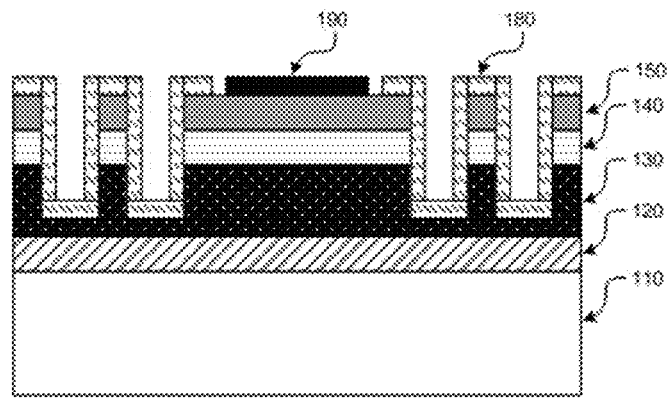
FIG. 4 shows p-electrode formation.

A p-electrode 190 is formed on the surface of p-doped material layer 150, as shown in FIG. 4.

In an exemplary embodiment, the p-electrode is a multiple-layer metal structure that provides an ohmic contact to the p-doped material layer. One of the metal layers is selected to be a reflective material such as aluminum or silver. This reflector functions as a mirror for emissions from MQW layer 140.

Figure 5:
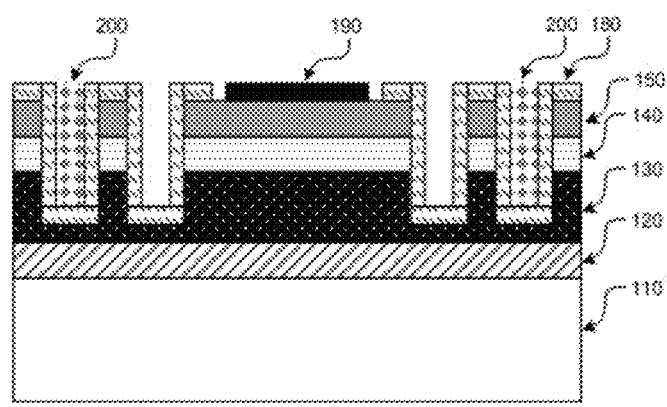
FIG. 5 depicts polish stop formation through filling trenches with a hard material.

In FIG. 5, polish-stop material 200 is deposited in trenches 160. Polish-stop material 200 is selected from materials having a hardness greater than the hardness of the selected compound semiconductor material. Materials meeting this hardness criterion include diamond, diamond-like carbon, titanium nitride (TiNx), and titanium tungsten alloys (TiWx) although any material having the requisite hardness may be selected.

Figure 6:
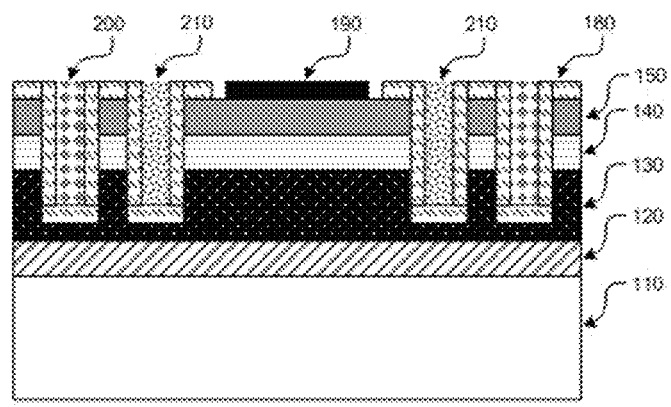
FIG. 6 depicts filling trenches with non-conductive filler.

In FIG. 6, trenches 170 are filled with a non-conductive, substantially transparent material such as polyimide or SU-8 (an epoxy-based resist material) although other non-conductive substantially transparent materials may be selected.

Figure 7:
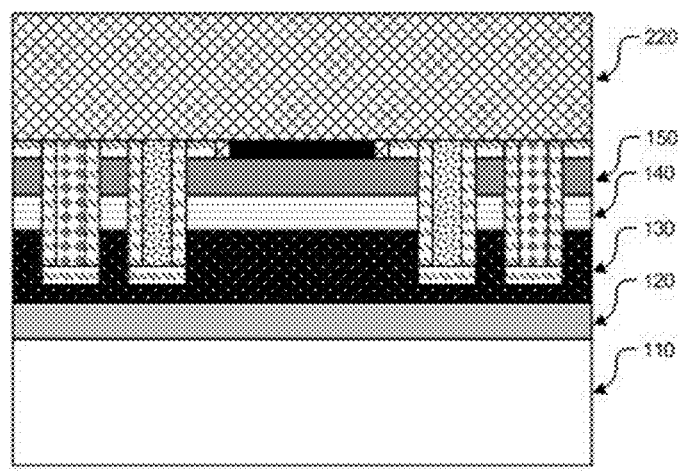
FIG. 7 shows the formation of a host substrate over the p-electrode and dielectric layer.

As seen in FIG. 7, a host substrate 220 is attached over p-electrode 190 and passivation material 180. Host substrate 220 is both thermally and electrically conductive and is typically selected from materials such as copper, silver, gold, silicon, silicon carbide, GaP, and GaAs. The host substrate may be deposited (e.g., electrodeposition of copper) or may be bonded (e.g., a copper plate or silicon wafer). Host substrate 220 electrically communicates with p-electrode 190. The expression "electrically communicates," as used herein, means that electrical currents that flow through p-electrode 190 also flow through substrate 220 whether through direct contact or through an intermediate medium such as a conductive bonding material.

Figure 8:
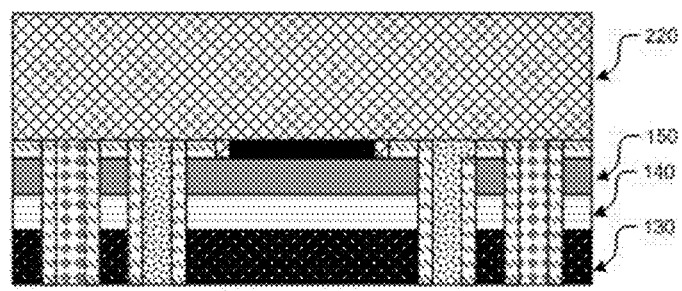
FIG. 8 depicts the removal of the substrate and exposure of the n-doped layer.

Removal of the first substrate 110 occurs in FIG. 8. The removal of substrate 110 occurs by polishing such as grinding, lapping, or chemical-mechanical polishing. During removal of the first substrate 110, at least a portion of the undoped compound semiconductor material layer 120 is also removed to reveal at least a portion of the n-doped layer 130. Removal of at least a portion of layer 120 occurs whether polish stops 200 terminate within the n-doped layer 130 or within the undoped layer 120. This is because the polishing process typically removes at least a portion of the layer in which the polish stops terminate due to deformation of the polishing medium (e.g., polishing pad) as it contacts polish stops 200. Therefore, even when the polish stop terminates in undoped layer 120, collateral removal of the undoped layer occurs beyond the polish stop, revealing a portion of n-doped layer 130

During or after the polishing, the n-doped layer may be roughened, enhancing light emission from the LED. Alternatively, a photonic crystal may be formed on the surface of the exposed n-doped material layer.

Figure 9:
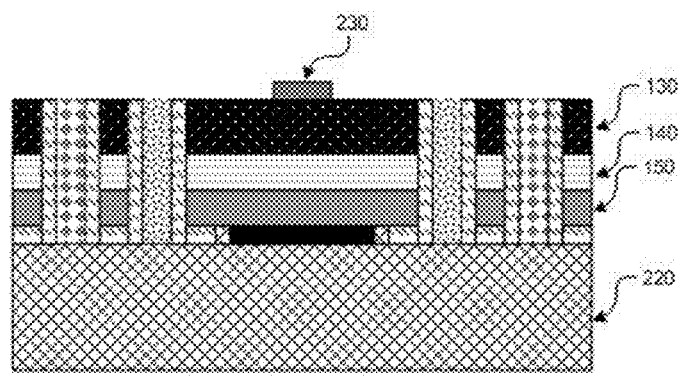
FIG. 9 shows n-electrode formation on the n-doped layer.

With the n-doped compound semiconductor layer 130 at least partially exposed, n-electrode 230 is formed in FIG. 9. Note that the orientation of FIG. 8 relative to FIG. 9 is rotated by 180 degrees. The n-electrode makes ohmic contact with n-doped layer 130 and may be a single-layer conductor or, in an exemplary embodiment may be a multilayer metal structure of titanium/aluminum/titanium/gold or other multilayer conductor structure.

Figure 10:
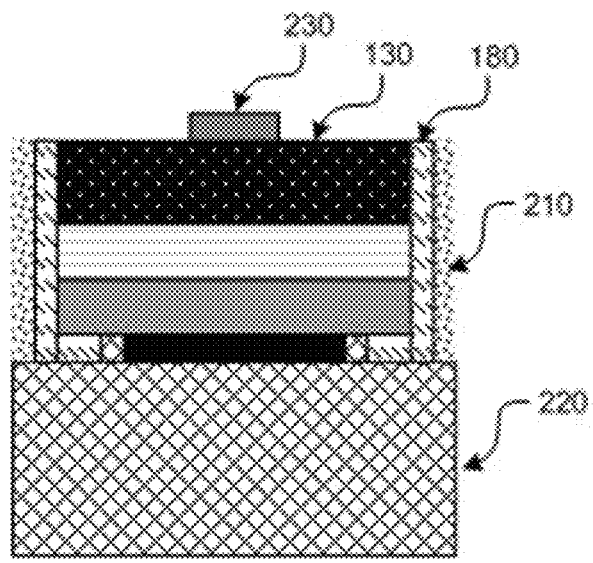
FIG. 10 depicts removal of the polish stops during device formation.

To form an LED, individual units are created by separation as seen in FIG. 10. Because some of the polish stop material, such as diamond-like carbon, absorb LED emissions, it is preferable for the separation to occur at a point where the polish stops will also be removed. Therefore, separation at a position within filled trenches 170 is selected in an exemplary embodiment. The removal of polish stops may be by dicing, such as laser dicing or saw dicing, or by chemical etching, such as an oxygen plasma. However, any technique which can remove the polish stops may be used to create the LEDs of the present invention.

Figure 11:
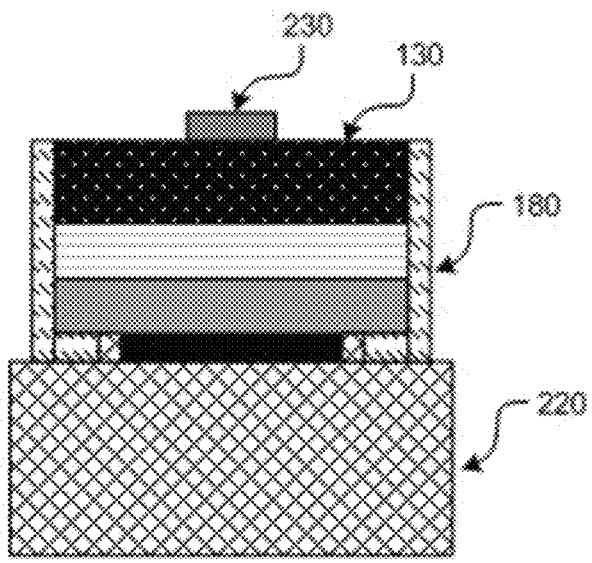
FIG. 11 shows the optional removal of non-conductive filler.

Optionally, any residual transparent filler material 210 may be removed, as seen in FIG. 11, by, for example, etching. An oxygen plasma may be selected for this etching.

While the foregoing invention has been described with respect to various embodiments, such embodiments are not limiting. Numerous variations and modifications would be understood by those of ordinary skill in the art. Such variations and modifications are considered to be included within the scope of the following claims.

The invention claimed is:

1. A method of fabricating a GaN vertical light emitting diode comprising:
   providing a first substrate capable of supporting GaN epitaxial growth thereon;
   forming a layer of undoped GaN on the first substrate;
   forming a layer of n-doped GaN over the first layer of undoped GaN;
   forming a multiple quantum well active layer over the n-doped GaN layer;
   forming a p-doped GaN layer over the multiple quantum well active layer;
   forming a p-electrode-including layer on the p-doped GaN layer, the p-electrode configured to act as a mirror;
   forming plural vertical polish stops from a material having a hardness greater than the hardness of GaN, each vertical polish stop passing through the p-doped GaN layer, the active layer, and terminating in either the n-doped GaN layer or the undoped GaN layer;
   forming a conductive host substrate layer over the p-electrode-including layer;
   polishing away the first substrate and at least a portion of the undoped GaN layer to reveal at least a portion of the n-doped GaN layer; and
   forming an n-electrode on the n-doped GaN layer.

2. A method of fabricating a GaN vertical light emitting diode according to claim 1 further comprising forming trenches filled with a non-conductive material selected from SiO, SiN, SU8, or polyimide.

3. A method of fabricating a GaN vertical light emitting diode according to claim 1, further comprising depositing the polish stops by a liftoff process.

4. A method of fabricating a GaN vertical light emitting diode according to claim 1, further comprising removing the polish stops prior to final device fabrication.

5. A method of fabricating a GaN vertical light emitting diode according to claim 2 further comprising separation into individual devices through the non-conductive material such that the polish stops are removed during the separation.

6. A method of fabricating a GaN vertical light emitting diode according to claim 4 wherein the removing of polish stops is selected from laser dicing, saw dicing, or chemical etching.

7. A method of fabricating a GaN vertical light emitting diode according to claim 1 wherein the material of the polish stops is selected from diamond, diamond-like carbon, titanium nitride (TiNx), or titanium tungsten alloy (TiWx).

8. A method of fabricating a GaN vertical light emitting diode according to claim 1 wherein the polish stops terminate in the n-doped GaN layer and the polishing away includes the first substrate and all of the undoped GaN layer.

9. A method of fabricating a GaN vertical light emitting diode according to claim 1 wherein the polishing is selected from grinding, lapping, or chemical-mechanical polishing.

10. A GaN vertical light emitting diode made by the process of claim 1.

11. A method of fabricating a compound semiconductor vertical light emitting diode comprising:
   providing a first substrate capable of supporting compound semiconductor epitaxial growth thereon;
   forming a layer of undoped compound semiconductor on the first substrate;
   forming a first layer of p or n doped compound semiconductor over the layer of undoped compound semiconductor;
   forming a multiple quantum well active layer over the first doped compound semiconductor layer;
   forming a second layer of p or n doped compound semiconductor layer over the multiple quantum well active layer, the doping of second layer being opposite to the doping of the first doped compound semiconductor layer;
   forming a first electrode-including layer on the second doped compound semiconductor layer, the first electrode being configured to act as a mirror;
   forming plural vertical polish stops from a material having a hardness greater than the hardness of the compound semiconductor, each vertical polish stop passing through the second doped compound semiconductor layer, the active layer, and terminating in either the first doped compound semiconductor layer or the undoped compound semiconductor layer;
   forming a conductive host substrate layer over the first electrode-including layer;
   polishing away the first substrate and at least a portion of the undoped compound semiconductor layer to reveal at least a portion of the first doped compound semiconductor layer; and
   forming a second electrode on the first doped compound semiconductor layer.

12. A method of fabricating a compound semiconductor vertical light emitting diode according to claim 11 wherein the compound semiconductor is selected from InGaP, AlInGaN, AlInGaP, AlGaAs, GaAsP, InGaAsP, InGaN, GaN, AlGaN, or combinations thereof.

13. A method of fabricating a compound semiconductor vertical light emitting diode according to claim 11 further comprising forming trenches filled with a non-conductive material selected from SiO, SiN, SU8, or polyimide.

14. A method of fabricating a compound semiconductor vertical light emitting diode according to claim 11, further comprising depositing the polish stops by a liftoff process.

15. A method of fabricating a compound semiconductor vertical light emitting diode according to claim 11, further comprising removing the polish stops prior to final device fabrication.

16. A method of fabricating a compound semiconductor vertical light emitting diode according to claim 13, further comprising separation into individual devices through the non-conductive material such that the polish stops are removed during the separation.

17. A method of fabricating a compound semiconductor vertical light emitting diode according to claim 16 wherein the removing of polish stops is selected from laser dicing, saw dicing, or chemical etching.

18. A method of fabricating a compound semiconductor vertical light emitting diode according to claim 11 wherein the material of the polish stops is selected from diamond, diamond-like carbon, titanium nitride (TiNx), or titanium tungsten alloy (TiWx).

19. A method of fabricating a compound semiconductor vertical light emitting diode according to claim 11 wherein the polish stops terminate in the n-doped layer and the polishing away includes the first substrate and all of the undoped layer.

20. A method of fabricating a compound semiconductor vertical light emitting diode according to claim 11 wherein the polishing is selected from grinding, lapping, or chemical-mechanical polishing.

21. A compound semiconductor vertical light emitting diode made by the process of claim 11.

* * * * *